US012701766B2

(12) United States Patent
Chen et al.

(10) Patent No.: US 12,701,766 B2
(45) Date of Patent: Aug. 4, 2026

(54) REPLACEMENT SIDEWALL SPACERS

(71) Applicant: Taiwan Semiconductor Manufacturing Company, Ltd., Hsinchu (TW)

(72) Inventors: Chang-Ta Chen, Taipei (TW); Ming-Chang Wen, Kaohsiung (TW); Kuo-Feng Yu, Hsinchu (TW); Chen-Yu Tai, Miaoli (TW); Yun Lee, Taipei (TW); Poya Chuang, Hsinchu (TW); Chun-Ming Yang, Taipei (TW); Yoh-Rong Liu, Taipei (TW); Ya-Ting Yang, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 548 days.

(21) Appl. No.: 17/662,126

(22) Filed: May 5, 2022

(65) Prior Publication Data

US 2023/0361199 A1     Nov. 9, 2023

(51) Int. Cl.
H10D 64/01 (2025.01)
H10D 30/01 (2025.01)
(Continued)

(52) U.S. Cl.
CPC ......... H10D 64/021 (2025.01); H10D 30/031 (2025.01); H10D 30/6734 (2025.01);
(Continued)

(58) Field of Classification Search
CPC ............. H01L 29/6656; H01L 29/0665; H01L 29/401; H01L 29/42392; H01L 29/6653;

H01L 29/66545; H01L 29/66553; H01L 29/66742; H01L 29/78648; H01L 29/66795; H01L 29/7851; H10D 64/021;
(Continued)

(56) References Cited

U.S. PATENT DOCUMENTS 11,031,500 B2     6/2021   Huang et al.
2015/0221737 A1*   8/2015   Liao ..................... H01L 29/4958
                                                  257/773
(Continued)

FOREIGN PATENT DOCUMENTS

CN          110783404 A      2/2020

*Primary Examiner* — Syed I Gheyas
(74) *Attorney, Agent, or Firm* — Ingrassia Fisher & Lorenz, LLP | IF&L

(57) ABSTRACT

Provided is a device with a replacement spacer structure and a method for forming such a structure. The method includes forming an initial spacer structure, wherein the initial spacer structure has an initial etch rate for a selected etchant. The method further includes removing a portion of the initial spacer structure, wherein a remaining portion of the initial spacer structure is not removed. Also, the method includes forming a replacement spacer structure adjacent to the remaining portion of the initial spacer structure to form a combined spacer structure, wherein the combined spacer structure has an intermediate etch rate for the selected etchant that is less than the initial etch rate for a selected etchant. Further, the method includes etching the combined spacer structure with the selected etchant to form a final spacer structure.

20 Claims, 9 Drawing Sheets

(51) Int. Cl.

| | |
|---|---|
| _H10D 30/67_ | (2025.01) |
| _H10D 62/10_ | (2025.01) |
| _H10D 30/62_ | (2025.01) |

(52) U.S. Cl.
CPC ....... _H10D 30/6735_ (2025.01); _H10D 62/118_ (2025.01); _H10D 64/01_ (2025.01); _H10D 64/015_ (2025.01); _H10D 64/017_ (2025.01); _H10D 64/018_ (2025.01); _H10D 30/024_ (2025.01); _H10D 30/6211_ (2025.01)

(58) Field of Classification Search
CPC ............. H10D 30/6735; H10D 62/118; H10D 64/015; H10D 64/017; H10D 30/797; H10D 30/43; H10D 62/121
See application file for complete search history.

(56) References Cited

U.S. PATENT DOCUMENTS

| | | | |
|---|---|---|---|
| 2015/0287798 A1* | 10/2015 | Hsiao | H01L 29/6656 |
| | | | 257/288 |
| 2021/0273073 A1* | 9/2021 | Lian | H01L 27/0886 |

\* cited by examiner

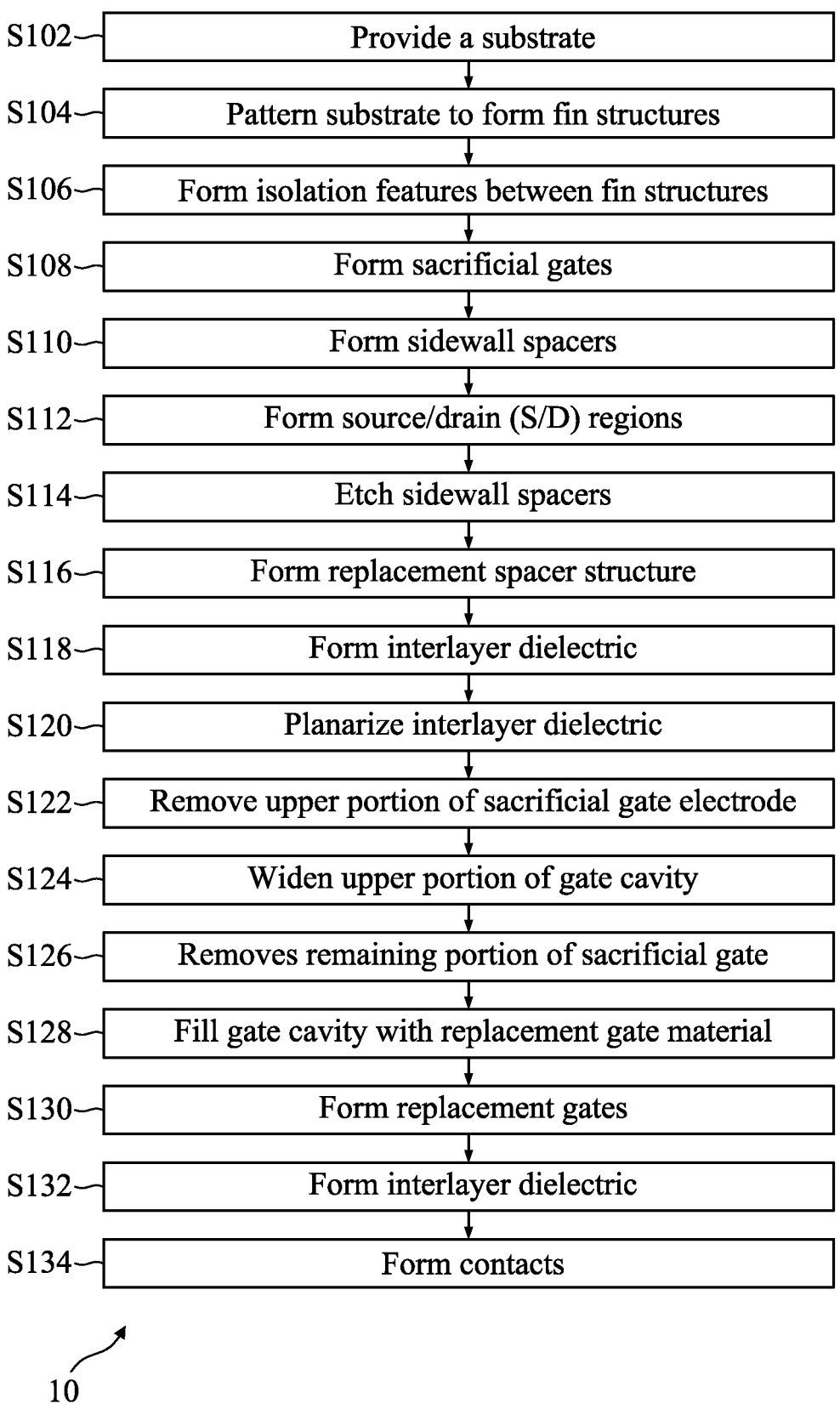

S102 — Provide a substrate

S104 — Pattern substrate to form fin structures

S106 — Form isolation features between fin structures

S108 — Form sacrificial gates

S110 — Form sidewall spacers

S112 — Form source/drain (S/D) regions

S114 — Etch sidewall spacers

S116 — Form replacement spacer structure

S118 — Form interlayer dielectric

S120 — Planarize interlayer dielectric

S122 — Remove upper portion of sacrificial gate electrode

S124 — Widen upper portion of gate cavity

S126 — Removes remaining portion of sacrificial gate

S128 — Fill gate cavity with replacement gate material

S130 — Form replacement gates

S132 — Form interlayer dielectric

S134 — Form contacts

REPLACEMENT SIDEWALL SPACERS

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It should be noted that, in accordance with the standard practice in the industry, various features may not be drawn to scale. In fact, the dimensions of the various features may be arbitrarily increased or reduced for clarity of discussion.

FIG. 1 illustrates a flow chart of a method for forming a semiconductor device according to various aspects of the present disclosure.

DETAILED DESCRIPTION

Figure 2:
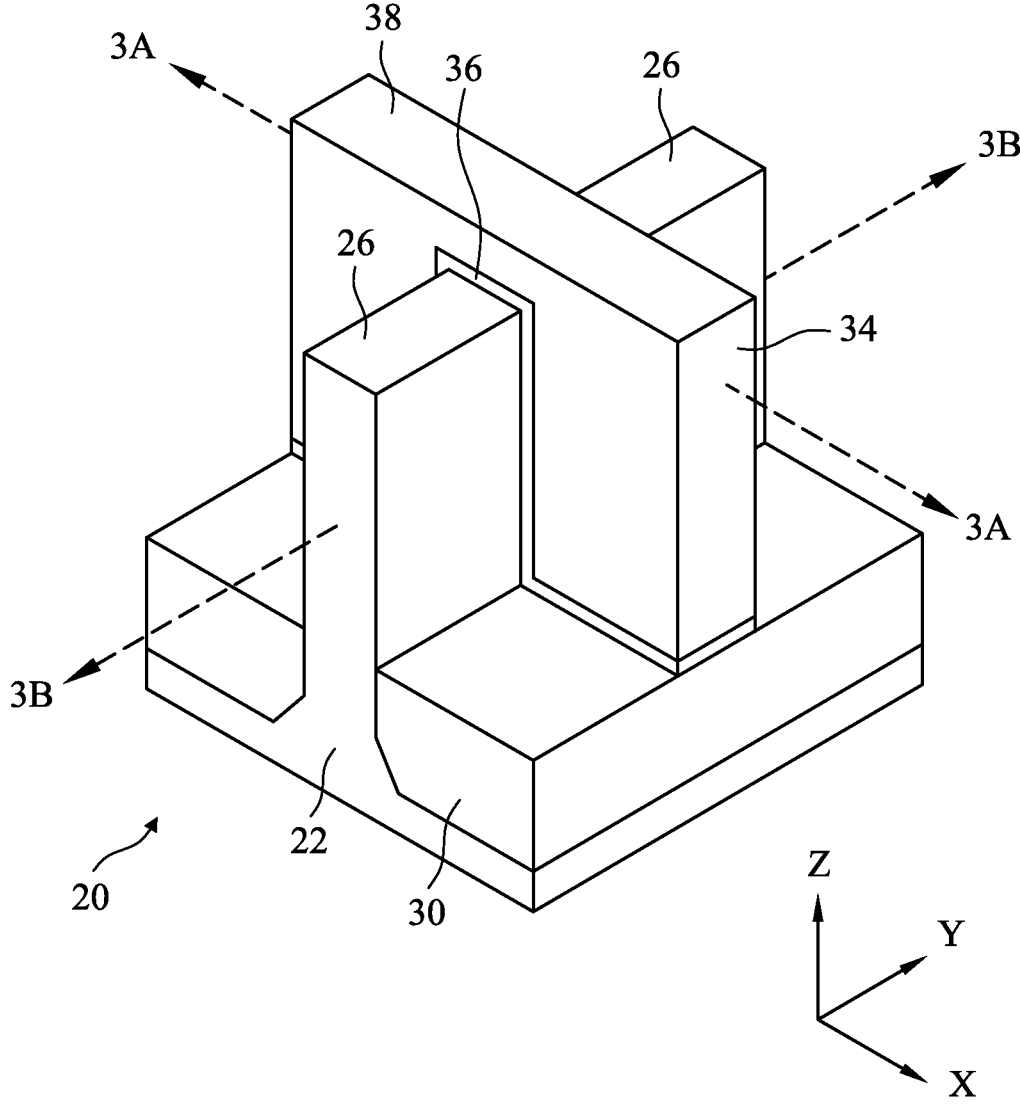
FIG. 2 is a perspective view of a semiconductor device in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

In addition, the present disclosure may repeat reference numerals and/or letters in the various examples. This repetition is for the purpose of simplicity and clarity and does not in itself dictate a relationship between the various embodiments and/or configurations discussed.

Various embodiments provide a semiconductor device and methods of forming a semiconductor device. In some embodiments, a sacrificial gate is formed, and a sidewall spacer is formed along sidewalls of the sacrificial gate. Epitaxial structures, such as source/drain regions, are then formed in or above the substrate or fin. A portion of the sidewall spacer is then removed and is replaced with a replacement spacer material having a lower etch rate when etched by a selected etchant, as compared to the sidewall spacer material. An interlayer dielectric (ILD) material is then deposited. The sacrificial gate is removed, thereby forming a gate cavity. During removal of the sacrificial gate, an upper portion of the sidewall spacers is completely removed such that an upper portion of the gate cavity is defined by the replacement material. The replacement material separates the gate cavity from the interlayer dielectric material, such that the interlayer dielectric material is not etched or damaged during removal of any portion of the sacrificial gate. A lower portion of the gate cavity may be defined by a lower portion of the sidewall spacer. After removal of the sacrificial gate, a gate dielectric layer is deposited along sidewalls and a bottom surface of the gate cavity, and then the remaining portions of the gate cavity are filled by depositing one or more gate tuning layers and one or more gate electrode layers in the gate cavity.

In certain embodiments, the wide opening in the upper portion of the gate cavity allows for the filling of the gate cavity by the one or more gate dielectric layers, one or more gate tuning layers, and one or more gate electrodes to be more easily performed. For example, in some processes where a gate cavity is filled by multiple layers, such as gate dielectric layers, gate tuning layers, or gate electrode layers, when the gate cavity has a high aspect ratio the filling of the gate cavity may result in the creation of one or more voids and/or seams in the filled metal portions. A gate structure that contains one or more voids or seams may experience a degradation of performance. For example, the gate resistance of the gate structure may be increased due to the presence of one or more voids or seams. The gate structure may experience increased delay due to the presence of one or more voids or seams. In accordance with some embodiments, the wide gate cavity enables filling of the gate cavity to be performed with reduced voids or seams, or no voids or seams. As such, performance of the gate structure may be improved.

Further, in certain embodiments, replacement of a material with a relatively faster etch rate with a replacement material having a relatively slower etch rate (for a selected etchant) allows for the etch process for forming the wide opening of the upper portion of the gate cavity to be controlled so that the interlayer dielectric material is not inadvertently etched. Thus, replacing an outer portion of the sidewall spacer, relative to the sacrificial gate structure, with the replacement material provides for a more easily controlled and broader process window. In certain embodiments, the new sidewall structure, including a remaining portion of the sidewall spacer and the replacement material, has a same width as the original width of the sidewall spacer.

Various embodiments are discussed herein in a particular context, namely, forming a FinFET transistor. However, various embodiments may be applied to other semiconductor devices/processes, such as planar transistors, and the like. Further, some embodiments discussed herein are discussed in the context of devices formed using a gate-last process. In other embodiments, a gate-first process may be used.

Referring now to the Figures, FIG. 1 illustrates a flow chart of a method 10 for forming a structure, such as a FinFET transistor, according to various aspects of the present disclosure. FIG. 1 is described in conjunction with FIGS. 2, 3A-3B and 4-14 which illustrate a semiconductor device 20 at various stages of fabrication in accordance with some embodiments of the present disclosure of the method 10. The method 10 is merely an example, and is not intended to limit the present disclosure beyond what is explicitly recited in the claims. Additional steps may be provided before, during, and after method 10, and some of the steps described can be moved, replaced, or eliminated for additional embodiments of method 10. Additional features may be added in the semiconductor device depicted in the Figures and some of the features described below can be replaced, modified, or eliminated in other embodiments of the semiconductor device.

As with the other method embodiments and exemplary devices discussed herein, it is understood that parts of the semiconductor device 20 may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, and/or other logic devices, etc., but is simplified for a better understanding of concepts of the present disclosure. In some embodiments, the exemplary devices include a plurality of semiconductor devices (e.g., transistors), including PFETs, NFETs, etc., which may be interconnected. Moreover, it is noted that the process steps of method 10, including any descriptions given with reference to the Figures, as with the remainder of the method and exemplary figures provided in this disclosure, are merely exemplary and are not intended to be limiting beyond what is specifically recited in the claims that follow.

At operation S102, the method 10 (FIG. 1) provides a substrate 22, as shown in FIG. 2. In some embodiments, the substrate 22 may be a semiconductor substrate such as a silicon (Si) substrate. The substrate 22 may include various layers, including conductive or insulating layers formed on a semiconductor substrate. The substrate 22 may include various doping configurations depending on design requirements as is known in the art. For example, different doping profiles (e.g., p-well, n-well) may be formed on the substrate 22 in regions designed for different device types (e.g., n-type field effect transistors (NFET), p-type field effect transistors (PFET)). The suitable doping may include ion implantation of dopants and/or diffusion processes, such as boron (B) for the p-well and phosphorous (P) for the n-well. In some embodiments, the substrate 22 includes a single crystalline semiconductor layer on at least its surface portion. The substrate 22 may comprise a single crystalline semiconductor material such as, but not limited to Si, Ge, SiGe, GaAs, InSb, GaP, GaSb, InAlAs, InGaAs, GaSbP, GaAsSb and InP. Alternatively, the substrate 22 may include a compound semiconductor and/or an alloy semiconductor. In the illustrated embodiment, the substrate 22 is made of crystalline Si.

One or more epitaxial layers (not expressly illustrated) may be formed over the substrate 22. The epitaxial layer may serve as channel region(s), such as in a subsequently formed multi-gate device.

As shown in FIG. 2, at operation S104, the method 10 (FIG. 1) patterns the substrate (and/or epitaxial stack) to form a fin structure 26. In some embodiments, the operation S104 includes forming and patterning a mask layer (not shown) over the substrate by using typical deposition and patterning operations. Operation S104 may form the fin structure 26 in an etching process, such as a dry etch (e.g., reactive ion etching), a wet etch, and/or other suitable process, through openings defined in the patterned mask layer. After forming the fin structure 26, the mask may be removed. While FIG. 2 illustrates the formation of one fin structure, any suitable number of the fin structures may be formed. Trenches are etched between adjacent fin structures.

Each fin structure 26 extends upwardly in the z-direction from the substrate 22 and extends lengthwise in the y-direction. Sidewalls of each fin structure 26 may be straight or inclined (not shown). In FIG. 2, additional fin structures would be spaced apart along the x-direction. The fin structures may have a same width or different widths.

In certain embodiments, the fin structure 26 is formed with a stack of semiconductor layers that are formed over the substrate 22, such as is shown in FIGS. 3B-14. Specifically, the fin structure 26 may include a stack of alternating layers 27 and 28 of different compositions. For example, in some embodiments, first semiconductor layers 27 of a first composition alternate with second semiconductor layers 28 of a second composition different from the first composition. Although three first semiconductor layers 27 and three second semiconductor layers 28 are shown, it is understood that the stack may include any number of layers of any suitable composition with various examples including between two and ten first semiconductor layers 27 and between two and ten second semiconductor layers 28.

In some embodiments, either of the semiconductor layers 27 and 28 may include silicon. In some embodiments, either of the semiconductor layers 27 and 28 may include other materials such as germanium (Ge), a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some embodiments, the semiconductor layer 27 may include from about 10% to about 70% Ge in molar ratio and the semiconductor layer 28 may include Si. In other embodiments, the semiconductor layer 27 may include Si and the semiconductor layer 28 may include from about 10% to about 70% Ge in molar ratio. In some embodiments, the semiconductor layers 27 and 28 may be undoped or substantially dopant-free (i.e., having an extrinsic dopant concentration from about 0 cm$^{-3}$ to about 1×10$^{17}$ cm$^{-3}$). Alternatively, the semiconductor layers 28 may be doped. For example, the semiconductor layers 27 or 28 may be doped with a p-type dopant such as boron (B), aluminum (Al), indium (In), and gallium (Ga) for forming a p-type channel, or an n-type dopant such as phosphorus (P), arsenic (As), antimony (Sb), for forming an n-type channel. In the depicted embodiments, the first semiconductor layers 27 are SiGe layers, and the second semiconductor layer 28 are Si layers.

In exemplary embodiments, the thickness of first semiconductor layers 27 may be from about 4 nm to about 10 nm. In some embodiments, the first semiconductor layers 27 may be substantially uniform in thickness. In some embodiments, the thickness of the semiconductor layer 28 is from about 4 nm to about 10 nm. In some embodiments, the second semiconductor layers 28 are substantially uniform in thickness. By way of example, growth of the layers of the stack may be performed by a molecular beam epitaxy (MBE) process, a metalorganic chemical vapor deposition (MOCVD) process, and/or other suitable epitaxial growth processes. In some embodiments, the growth of the layers of the stack may be performed using process gases comprising SiH$_4$, DCS, GeH$_4$, Si$_2$H$_6$, PH$_3$, HCl, GeH$_4$ or MMS (carbon source) and carrier gas comprising N$_2$ or H$_2$. The epitaxial growth process may be performed under process temperature in a range from about 400° C. to about 800° C. and under process pressure below about 50 torr, as example.

Processing may be later performed to remove either the first semiconductor layers 27 or the second semiconductor layers 28 using suitable etch techniques. The remaining semiconductor layers 27 or 28 are referred to as nanowires, such as for use in a gate-all-around (GAA) device. Such nanowires may have a cross-sectional profile of a rectangle and may be suspended.

Referring back to FIG. 2, at operation S106, the method 10 (FIG. 1) forms shallow trench isolation (STI) features (also denoted as STI features) 30 in trenches adjacent to each fin structure 26 with a dielectric layer. The isolation features 30 may be formed by first filling the trenches around each fin structure 26 with a dielectric material layer to cover top surfaces and sidewalls of the fin structure 26 (not shown). The dielectric material layer may include one or more dielectric materials. Suitable dielectric materials for the dielectric layer may include silicon oxides, silicon nitrides, silicon carbides, fluorosilicate glass (FSG), low-K dielectric materials, and/or other suitable dielectric materials. The dielectric material may be deposited by any suitable technique including thermal growth, flowable CVD (FCVD), HDP-CVD, PVD, ALD, and/or spin-on techniques. The dielectric material layer is then planarized by using, for example, chemical mechanical planarization (CMP), until top surfaces of the mask layer are revealed, and the dielectric material layer is recessed to form the shallow trench isolation features 30 (also denoted as STI features), as shown in FIG. 2. In the illustrated embodiment, the isolation features 30 are formed on the substrate 22. Any suitable etching technique may be used to recess the isolation features 30 including dry etching, wet etching, RIE, and/or other etching methods, and in an exemplary embodiment, an anisotropic dry etching is used to selectively remove the dielectric material of the isolation features 30 without etching the fin structure 26. The mask layer may also be removed before, during, and/or after the recessing of the isolation features 30. In some embodiments, the mask layer is removed by a CMP process performed prior to the recessing of the isolation features 30. In some embodiments, the mask layer is removed by an etchant used to recess the isolation features 30.

Although the isolation features 30 are described/illustrated as being separate from the substrate 22, as used herein the term "substrate" may be used to refer to just the semiconductor substrate or a semiconductor substrate inclusive of isolation features.

As shown in FIG. 2, at operation S108, the method 10 (FIG. 1) forms a dummy gate or sacrificial gate 34. The sacrificial gate 34 is formed over portions of the fin structure 26 which are to be channel regions. The sacrificial gate 34 may extend over a number of adjacent fin structures (not shown). Each sacrificial gate 34 includes a sacrificial gate dielectric 36 and a sacrificial gate electrode 38 over the sacrificial gate dielectric 36. As shown, the sacrificial gate 34 extends lengthwise in the x-direction. While FIG. 2 illustrates the formation of one sacrificial gate, any suitable number of sacrificial gates may be formed. Such sacrificial gates would be spaced apart in the y-direction (not shown).

Each sacrificial gate 34 is formed by first blanket depositing a sacrificial gate dielectric layer over the fin(s) 26. A sacrificial gate electrode layer is then blanket deposited on the sacrificial gate dielectric layer and over the fin(s) 26. The sacrificial gate dielectric layer includes silicon oxide, silicon nitride, or a combination thereof. The thickness of the sacrificial gate electrode layer is in a range from about 100 nm to about 20 nm in some embodiments. The sacrificial gate electrode layer includes silicon such as polycrystalline silicon or amorphous silicon. The thickness of the sacrificial gate dielectric layer is in a range from about 1 nm to about 5 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. A mask layer (not shown) is formed over the sacrificial gate electrode layer. Subsequently, a patterning operation is performed on the mask layer, and the sacrificial gate electrode layers and the sacrificial gate dielectric layer are patterned into the sacrificial gate 34, including sacrificial gate dielectric 36 and sacrificial gate electrode 38.

As shown, the fin structure 26 is partially exposed between and on opposite sides of the sacrificial gate 34, thereby defining source/drain (S/D) regions. In this disclosure, a source and a drain are interchangeably used and the structures thereof are substantially the same. The portion of the fin structure 26 under the sacrificial gate 34 includes alternating layers 27 and 28. During further processing, layers 27 or layers 28 are removed, leaving a void or gap between the remaining layers (27 or 28). In the illustrated embodiment described below layers 28 are removed and layers 27 remain.

Figure 3A:
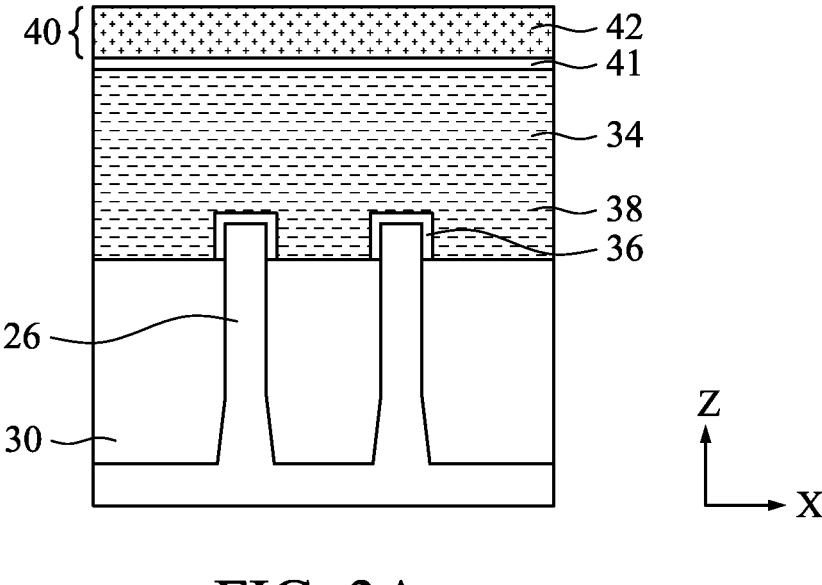
FIG. 3A is a cross sectional view, taken along the y-axis and along line 3A-3A in FIG. 2, of an intermediate stage of the manufacture of a semiconductor device in accordance with some embodiments.
Figure 3B:
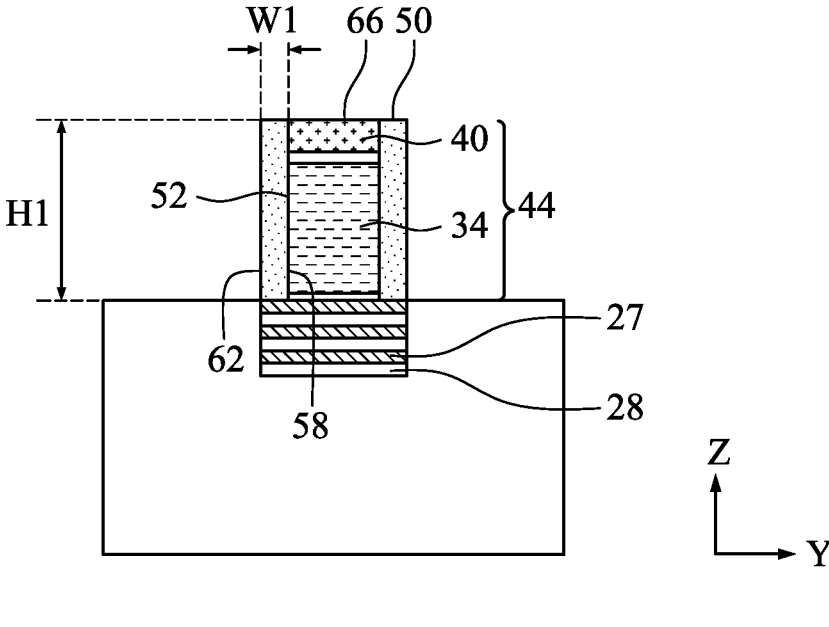
FIG. 3B is a cross sectional view, taken along the x-axis and along line 3B-3B in FIG. 2, of the intermediate stage of the manufacture of a semiconductor device of FIG. 3A in accordance with some embodiments.

Reference is now made to FIGS. 3A and 3B. FIG. 3A is a cross-sectional view taken along line 3A-3A in FIG. 2 and FIG. 3B is a cross-sectional view taken along line 3B-3B in FIG. 2. FIGS. 4-14 illustrate the same cross-sectional view as FIG. 3B. It is noted that FIG. 3A illustrates two fin structures rather than the single fin structure of FIG. 2. FIGS.

3A-14 are cross-sectional views of intermediate stages in the manufacturing of FinFETs, in accordance with some embodiments.

In FIGS. 3A and 3B, the sacrificial gate dielectric 36 is formed on the fin structures 26 and the sacrificial gate electrode 38 is formed over the sacrificial gate dielectric 36, and a mask 40 is formed over the sacrificial gate electrode 38. The sacrificial gate electrode 38 may be deposited over the sacrificial gate dielectric 36 and then planarized, such as by a CMP process. The mask 40 may be deposited over the sacrificial gate electrode 38.

The mask 40 may include two or more mask layers. For example, a lower mask 41 may be formed on the sacrificial gate electrode 38. In an exemplary embodiment, the lower mask 41 is formed from, for example, SiN, SiON, or the like. Also, an upper mask 42 may be formed over the lower mask 41. The upper mask 42 may be considered as a hard mask. An exemplary upper mask is silicon oxide or the like.

The mask 40 may be patterned using acceptable photolithography and etching techniques to form masks. The pattern of the mask 40 then may be transferred to the sacrificial gate electrode 38 and the sacrificial gate dielectric 36 by an acceptable etching technique to form sacrificial gate 34.

Collectively, the sacrificial gate 34, including the sacrificial gate dielectric 36 and the sacrificial gate electrode 38, and the mask 40 may be referred to as a sacrificial gate structure 44.

Further as shown in FIG. 3B, at operation S110, the method 10 (FIG. 1) forms the sidewall spacers 50 around sacrificial gate 34, the mask 40, and the fin structures 26.

The sidewall spacers 50 may be referred to as an initial spacer structure. The sidewall spacers may include gate seal spacers (not expressly illustrated) that are formed on the sacrificial gate 34, the mask 40, and the fin structures 26. A thermal oxidation or a deposition followed by an anisotropic etch may form the gate seal spacers. Further, the sidewall spacers 50 may include gate spacers (not expressly illustrated) that are formed on the gate seal spacers along and/or on sidewalls of the sacrificial gate 34 and the mask 40. The gate spacers may be formed by conformally depositing a material and subsequently anisotropically etching the material.

Exemplary sidewall spacers 50 may be formed from a dielectric material, such as silicon oxide, silicon nitride, silicon carbide, silicon oxynitride, or combinations thereof such as SiOC or SiOCN. In an exemplary embodiment, the sidewall spacers 50 are SiOCN. By way of example, the sidewall spacers may be formed by depositing spacer material using processes such as a subatmospheric CVD (SACVD) process, a flowable CVD process, an ALD process, a PVD process, or other suitable process respectively.

As shown in FIG. 3B, the sidewall spacers 50 are formed on an outer gate surface 52 defined by the sacrificial gate 34 and have an initial width W1 in the y-direction. The initial width W1 is measured from an inner sidewall surface 58 of each sidewall spacer 50 (which may be formed from the gate seal spacer if used) to an outer sidewall surface 62 of the sidewall spacer 50. While FIG. 3B illustrates the sidewall spacers 50 as having a uniform width, it is contemplated that the width may decrease in the upward direction. In such embodiments, the initial width W1 may refer to an initial maximum width, i.e., the width of the widest portion of the sidewall spacers 50.

As further shown, the sacrificial gate structure 44 (including sacrificial gate 34 and mask 40) and sidewall spacers 50 may have an initial height H1, defined as the distance in the z-direction from the fin structure 26 to the gate top 66 of the sacrificial gate structure 44 and sidewall spacers 50.

It is noted that, in certain embodiments, implants for lightly doped source/drain (LDD) regions (not explicitly illustrated) may be performed after formation of gate seal spacers and before formation of the gate spacers. Such implant processes involve formation of masks, such as a photoresist, implant of appropriate type impurities into the exposed surfaces of fin structures for each implant type, and an anneal to activate the implanted impurities.

Figure 4:
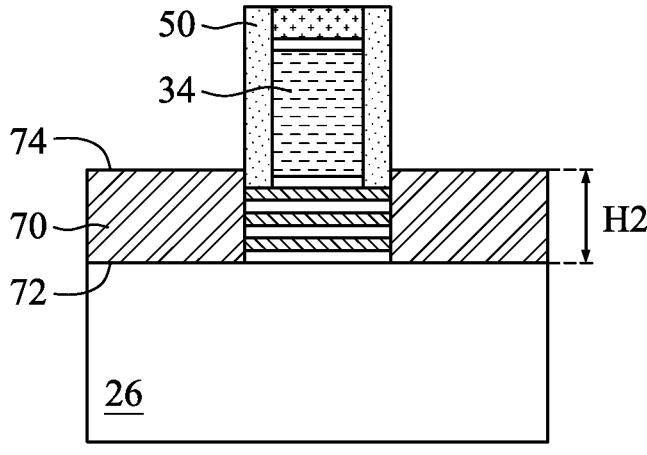
FIGS. 4-14 are cross sectional views, taken along the x-axis, of intermediate stages of the manufacture of a semiconductor device in accordance with some embodiments.

In FIG. 4, at operation S112, the method 10 (FIG. 1) forms the epitaxial source/drain regions 70 in the fin structures 26. The epitaxial source/drain regions 70 are formed in the fin structures 26 such that each sacrificial gate 34 is disposed between respective neighboring pairs of the epitaxial source/drain regions 70. In some embodiments, epitaxial source/drain regions 70 may extend into the fin structure 26. In some embodiments, the sidewall spacers 50 are used to separate the epitaxial source/drain regions 70 from the sacrificial gate 34 by an appropriate lateral distance so that the epitaxial source/drain regions 70 do not short out subsequently formed gates of the resulting FinFETs.

The epitaxial source/drain regions 70 may be formed by etching source/drain regions of the fin structures 26 to form recesses in the fin structures 26. Then, the epitaxial source/drain regions 70 are epitaxially grown in the recesses. The epitaxial source/drain regions 70 may include any acceptable material, such as appropriate for the desired type of FinFET. For example, if the fin structure 26 is silicon and the FinFET is n-type, the epitaxial source/drain regions 70 may include silicon, SiC, SiCP, SiP, or the like. If the fin structure 26 is silicon and the FinFET is p-type, the epitaxial source/drain regions 70 may comprise SiGe, SiGeB, Ge, GeSn, or the like.

In exemplary embodiments, each epitaxial source/drain region 70 may have a bottom epitaxial surface 72 and a top epitaxial surface 74. The top epitaxial surface 74 may be raised from respective surfaces of the fin structure 26 and may have facets. In FIG. 4, each epitaxial source/drain region 70 has a height H2 defined as the distance from the bottom epitaxial surface 72 to the top epitaxial surface 74 in the z-direction.

The epitaxial source/drain regions 70 and/or the fin structures 26 may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{41}$ cm$^{-3}$. The n-type and/or p-type impurities for source/drain regions may be any of the impurities previously discussed. In some embodiments, the epitaxial source/drain regions 70 may be in situ doped during growth.

Figure 5:
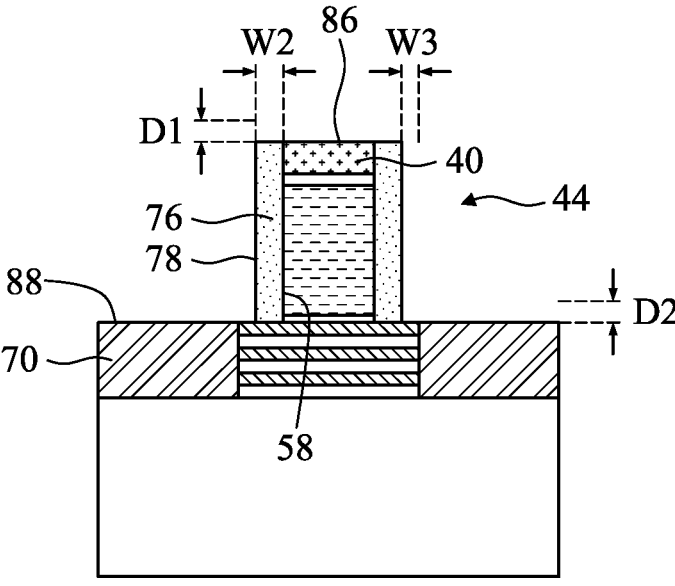

As shown in FIG. 5, at operation S114, the method 10 (FIG. 1) etches the sidewall spacers 50 to form a remaining sidewall portion 76 of the sidewall spacers with a recessed outer sidewall surface 78. As shown, the recessed outer sidewall surface 78 is distanced from the inner sidewall surface 58 of the sidewall spacer 50 by a reduced width W2. The removed portion of the sidewall spacer 50 has a removed width W3, such that the initial width W1 is equal to the sum of the reduced width W2 and removed width W3.

In certain embodiments, the initial width W1 is or is greater than 2 nanometers (nm), 3 nm, 4 nm, 5 nm, or 6 nm. In certain embodiments, the initial width W1 is or is less than 7 nm, 6 nm, 5 nm, 4 nm, or 3 nm.

In certain embodiments, the reduced width W2 is or is greater than 1 nm, 2 nm, 3 nm, 4 nm, or 5 nm. In certain embodiments, the reduced width W2 is or is less than 6 nm, 5 nm, 4 nm, 3 nm, or 2 nm.

In certain embodiments, the removed width W3 is or is greater than 0.25 nm, 0.5 nm, 0.75 nm, 1 nm, 1.25 nm, 1.5 nm, 1.75 nm, 2 nm, 2.25 nm, 2.5 nm, 2.75 nm, or 3 nm. In certain embodiments, the removed width W3 is or is less than 3 nm, 2.75 nm, 2.5 nm, 2.25 nm, 2 nm, 1.75 nm, 1.5 nm, 1.25 nm, 1 nm, 0.75 nm, 0.5 nm, or 0.25 nm.

In certain embodiments, the ratio of the reduced width W2 to the initial width W1 is or is greater than 1:6, 1:5, 1:4, 1:3, 2:5, 1:2, 3:5, 2:3, 3:4, 4:5, or 5:6. In certain embodiments, the ratio of the reduced width W2 to the initial width W1 is or is less than 5:6, 4:5, 3:4, 2:3, 3:5, 1:2, 2:5, 1:3, 1:4, 1:5, or 1:6.

As shown in FIG. 5, operation S114, etching the sidewall spacers 50 may also etch the mask 40 such that the sacrificial gate structure 44 has a recessed upper gate surface 86. The recessed upper gate surface 86 may be a distance D1 lower, in the z-direction, from the gate top 66 of the sacrificial gate structure 44 shown in FIG. 3B.

Also, operation S114, while etching the sidewall spacers 50, may etch the epitaxial source/drain regions 70 to form each epitaxial source/drain region 70 with a recessed upper epitaxial surface 88. The recessed upper epitaxial surface 88 may be a distance D2 lower, in the z-direction, than the top epitaxial surface 74 shown in FIG. 4. While the recessed upper epitaxial surface 88 is shown to be substantially parallel with the upper surface of the fin structure 26, the recessed upper epitaxial surface 88 may be at a height above or depth below the upper surface of the fin structure 26.

In various embodiments, each distance D1 and D2 independently is or is greater than 0.25 nm, 0.5 nm, 0.75 nm, 1 nm, 1.25 nm, 1.5 nm, 1.75 nm, 2 nm, 2.25 nm, or 2.5 nm; and is or is less than 2.5 nm, 2.25 nm, 2 nm, 1.75 nm, 1.5 nm, 1.25 nm, 1 nm, 0.75 nm, 0.5 nm, or 0.25 nm.

Figure 6:
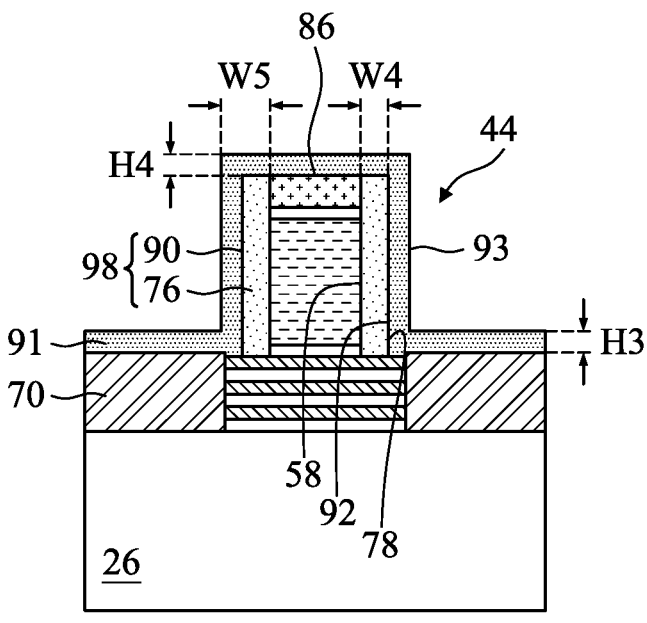

As shown in FIG. 6, at operation S116, the method 10 (FIG. 1) forms a replacement spacer structure 90 adjacent to the remaining sidewall portion 76 of the sidewall spacers. Specifically, a replacement material layer 91 is deposited over the epitaxial source/drain regions 70 in fin structure 26, and over the sacrificial gate structure 44.

In an exemplary embodiment, the replacement material layer 91 may comprise a dielectric material, such as, silicon carbon nitride (SiCN), silicon nitride, silicon oxide, silicon ox nitride, or the like.

As shown, the replacement material layer 91 is formed with a thickness or height H3 in the z-direction over the epitaxial source/drain regions 70. Further, the replacement material layer 91 is formed with a thickness or height H4 in the z-direction, over the recessed upper gate surface 86 of the sacrificial gate structure 44.

Generally, each of heights H3 and H4 is uniform. In embodiments wherein either height H3 and H4 is not uniform, such height H3 or H4 may refer to a maximum height. In certain embodiments, each of heights H3 and H4 independently is or is greater than 1 nm, 2 nm, 3 nm, 4 nm, or 5 nm. In certain embodiments, each of heights H3 and H4 independently is or is less than 7 nm, 6 nm, 5 nm, 4 nm, 3 nm, 2 nm, or 1 mm.

As shown, a vertical portion of the replacement material layer 91, i.e., extending in the vertical direction, is formed on the recessed outer sidewall surface 78 of the remaining sidewall portion 76 of the sidewall spacers. The vertical portion of the replacement material layer 91 is considered to be the replacement spacer structure 90. In certain embodiments, the replacement spacer structure 90 is an etch stop layer or contact etch stop layer.

The combination of the replacement spacer structure 90 and the remaining sidewall portion 76 of the sidewall spacers defines a combined spacer structure 98. In exemplary embodiments, the sidewall spacer 50 has a first etch rate or initial etch rate, by a selected etchant, and the replacement spacer structure 90 has a second etch rate, by the selected etchant. In exemplary embodiments, the first etch rate is greater than the second etch rate. Therefore, the combined spacer structure 98 has an intermediate etch rate for the selected etchant that is less than the initial etch rate for the selected etchant.

Further, the portion of the replacement material layer 91 on the recessed outer sidewall surface 78, i.e., the replacement spacer structure 90, is formed with a thickness or width W4 in the y-direction.

In an exemplary embodiment, the replacement spacer structure 90 has an inner replacement side 92 adjacent to and directly on the recessed outer sidewall surface 78 of the remaining sidewall portion 76 of the sidewall spacers. In an exemplary embodiment, the replacement spacer structure 90 has an outer replacement side 93 distanced from the inner replacement side 92 by the width W4 in the y-direction. Generally, the width W4 of the replacement spacer structure 90 is uniform. In embodiments wherein the width W4 of the replacement spacer structure 90 is not uniform, the width W4 may refer to a maximum thickness, i.e., the greatest distance between the outer replacement side 93 and the inner replacement side 92 in the y-direction.

In certain embodiments, the width W4 is or is greater than 1 nm, 2 nm, 3 nm, 4 nm, or 5 nm. In certain embodiments, the width W4 is or is less than 7 nm, 6 nm, 5 nm, 4 nm, 3 nm, 2 nm, or 1 mm.

In exemplary embodiments, the outer replacement side 93 is distanced from the inner sidewall surface 58 by a total thickness or width W5. In exemplary embodiments, the width W4 to width W5 ratio is or is greater than 1:6, 1:5, 1:4, 1:3, 2:5, 1:2, 3:5, 2:3, 3:4, 4:5, or 5:6. In exemplary embodiments, the width W4 to width W5 ratio is or is less than 5:6, 4:5, 3:4, 2:3, 3:5, 1:2, 2:5, 1:3, 1:4, 1:5, or 1:6.

In exemplary embodiments, the total width W5 is or is at least 90%, 95%, 100%, 105%, 110%, 115% or 120% of the initial width W1. In certain embodiments, the total width W5 is substantially equal to the initial width W1.

Figure 7:
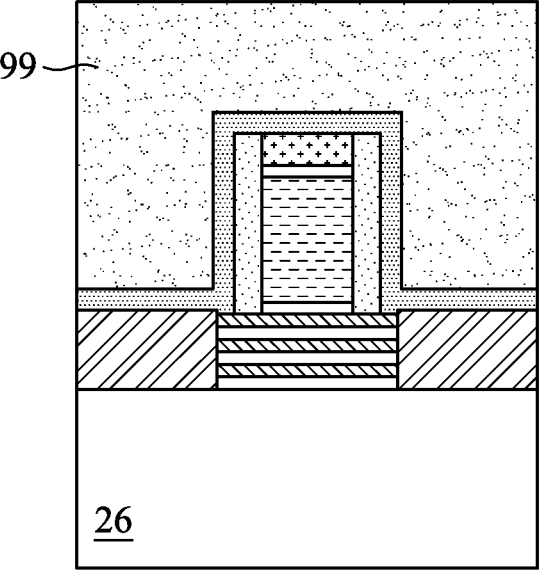

As shown in FIG. 7, at operation S118, the method 10 (FIG. 1) forms an interlayer dielectric (ILD) 99 over the substrate or fin structure 26 and structure illustrated in FIG. 6. In an exemplary embodiment, the ILD 99 may be formed of a dielectric material or a semiconductor material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium ($Si_xGe_{1-x}$), where x can be between approximately 0 and 1), pure germanium, or the like. In some embodiments oxide or nitride films may be used. Other insulation or semiconductor materials formed by any acceptable process may be used. The deposited material may be planarized, Method 10 (FIG. 1) may continue with removal of the sacrificial gate structure to form a gate cavity, as shown in FIGS. 8-11.

Figure 8:
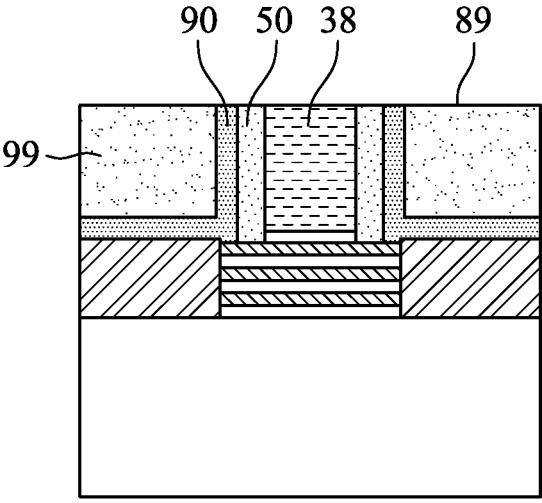

In FIG. 8, at operation S120, the method 10 (FIG. 1) performs a planarization process, such as a CMP, to form a level top surface 89 of the ILD 99, sidewall spacers 50, and sacrificial gate electrode 38. The planarization process may remove the mask 40 on the sacrificial gate electrode 38, and the uppermost portions of the replacement spacer structure 90 along sidewalls of the mask 40. After the planarization process, top surfaces of the sacrificial gate electrode 38, sidewall spacer 50, replacement spacer structure 90, and the ILD 99 are level. Accordingly, the top surfaces of the sacrificial gate electrode 38 are exposed through the ILD 99.

Figure 9:
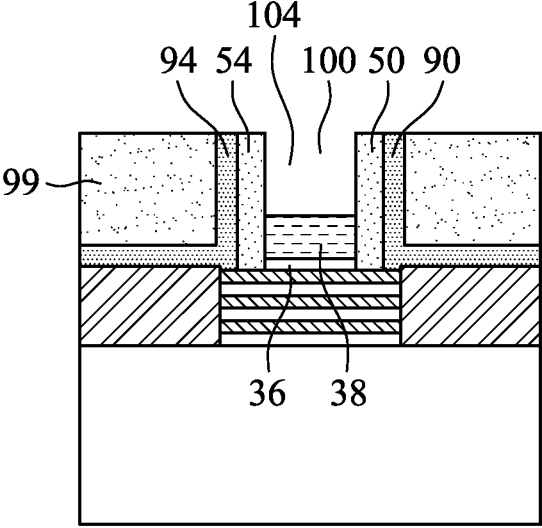

As shown in FIG. 9, at operation S122, the method 10 (FIG. 1) an upper portion of the sacrificial gate electrode 38 is removed in an etching step(s), so that an upper cavity portion 104 of a gate cavity 100 is formed. In some embodiments, the upper portion of the sacrificial gate electrode 38 is removed by an anisotropic dry etch process. For example, the etching process may include a dry etch process using reaction gas(es) that selectively etch the sacrificial gate electrode 38 without etching the ILD 99 or the sidewall spacers 50.

In FIG. 9, it may be seen that the upper cavity portion 104 of gate cavity 100 is surrounded by an upper sidewall portion 54 of sidewall spacer 50 and an upper replacement portion 94 of replacement spacer structure 90 adjacent to the upper sidewall portion 54.

Further, as shown, a portion of the sacrificial gate electrode 38 remains between the upper cavity portion 104 of a gate cavity 100 and the sacrificial gate dielectric 36.

Figure 10:
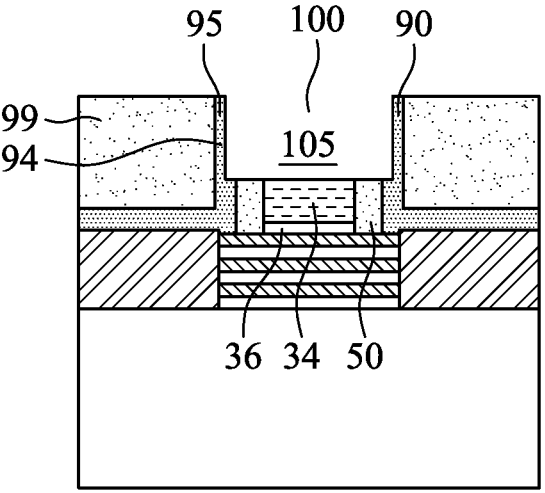

As shown in FIG. 10, at operation S124, the method 10 (FIG. 1) widens the upper cavity portion of gate cavity 100 to form a widened upper cavity portion 105 of gate cavity 100, such as by a selected etch process with a selected etchant, such as a wet etch process with a dilute hydrofluoric (dHF) acid etch. Other suitable etch process and etchants may be used.

In FIG. 10, forming the widened upper cavity portion 105 of gate cavity 100 includes removing all of the upper sidewall portion 54 (shown in FIG. 9) of sidewall spacer 50. Further, widening the upper cavity portion 104 of gate cavity 100 includes removing an inner portion, with respect to gate cavity 100, of the upper replacement portion 94 of replacement spacer structure 90. A remaining portion 95 of the upper replacement portion 94 of replacement spacer structure 90 remains after widening the gate cavity 100 and separates the gate cavity 100 from the ILD 99.

In exemplary embodiments, the sidewall spacer 50 has a first etch rate, by a selected etchant, and the replacement spacer structure 90 has a second etch rate, by the selected etchant. In exemplary embodiment, the first etch rate is greater than the second etch rate. In certain embodiments, the first etch rate is or is at least three times greater than the second etch rate, four times greater than the second etch rate, five times greater than the second etch rate, or six times greater than the second etch rate. Therefore, the process for widening the upper cavity portion of gate cavity 100 to form the widened upper cavity portion 105 of gate cavity 100 can be suitably controlled such that the upper cavity portion of gate cavity 100 is sufficiently widened without etching through the remaining portion 95 of the upper replacement portion 94 of replacement spacer structure 90.

Figure 11:
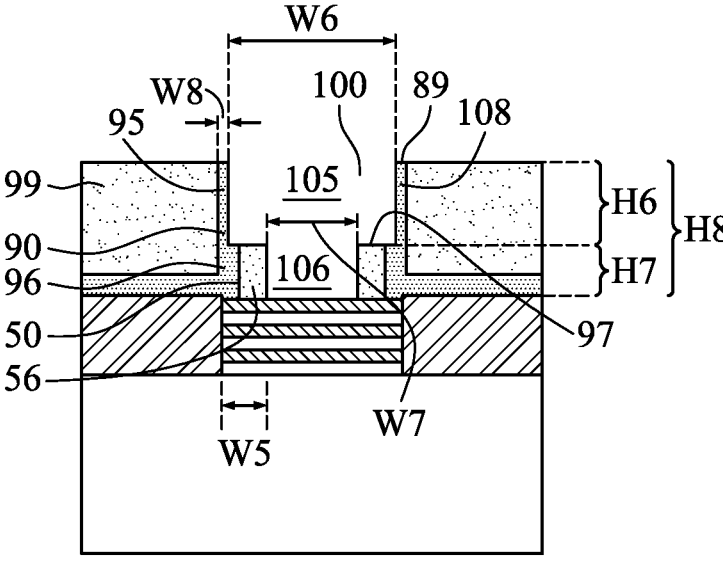

As shown in FIG. 11, at operation S126, the method 10 (FIG. 1) removes the remaining portion of the sacrificial gate 34 (shown in FIG. 10), including the remaining portion of the sacrificial gate electrode 38 (shown in FIG. 10) and the sacrificial gate dielectric 36 (shown in FIG. 10), in an etching step(s) to form and complete the gate cavity 100 with the widened upper cavity portion 105 and a lower cavity portion 106. In some embodiments, the remaining portion of the sacrificial gate electrode 38 is removed by an anisotropic dry etch process. For example, the etching process may include a dry etch process using reaction gas(es) that selectively etch the sacrificial gate electrode 38 without etching the ILD 99, the sidewall spacers 50, or the replacement spacer structure 90. Etching the sacrificial gate electrode 38 may expose an upper surface of sacrificial gate dielectric 36. While etching the sacrificial gate electrode 38, the sacrificial gate dielectric 36 may be used as an etch stop layer.

Thereafter, the sacrificial gate dielectric 36 may be removed in an etching process, such as an anisotropic dry etch process. For example, the etching process may include a dry etch process using reaction gas(es) that selectively etch the sacrificial gate dielectric 36 exposed in the gate cavity 100 without etching the remaining portion of sidewall spacers 50, the replacement spacer structure 90, or the ILD 99.

In FIG. 11, it may be seen that the lower cavity portion 106 of gate cavity 100 is surrounded by a remaining lower sidewall portion 56 of the sidewall spacer 50 located inside of an adjacent lower replacement portion 96 of replacement spacer structure 90. In exemplary embodiments, neither the sidewall lower portion 56 nor the lower replacement portion 96 are etched by the gate structure removal process.

FIG. 11 illustrates the final spacer structure 108 formed by the sidewall spacers 50 and replacement structure 90. As shown, the final spacer structure 108 includes the remaining lower sidewall portion 56 of the sidewall spacer 50, the lower replacement portion 96 of the replacement spacer structure 90, and the remaining upper replacement portion 95 of the replacement spacer structure 90. A substantially horizontal shoulder 97 (in a horizontal plane defined by the x-axis and y-axis) is defined at the interface between the widened upper cavity portion 105 of the gate cavity 100 and the lower cavity portion 106 of the gate cavity 100.

As shown in FIG. 11, the widened upper cavity portion 105 has a width W6 in the y-direction, and the lower cavity portion 106 has a width W7 in the y-direction. As shown in FIG. 11, the widened upper cavity portion 105 has a height H6 in the z-direction, and the lower cavity portion 106 has a height H7 in the z-direction. Likewise, the remaining upper replacement portion 95 of the replacement spacer structure 90 (and the removed portion of sidewall spacers 50) has a height H6 in the z-direction from the shoulder 97 to the top surface 89; and the lower sidewall portion 56 and lower replacement portion 96 have a height H7 in the z-direction from the shoulder 97 to the surface of the substrate. The final spacer structure 108 has a total height H8 in the z-direction from top surface 89 to the surface of the substrate.

In certain embodiments, the width W6 is or is greater than 5 nm, 6 nm, 7 nm, 8 nm, 9 nm, or 10 nm. In certain embodiments, the width W6 is or is less than 10 nm, 9 nm, 8 nm, 7 nm, 6 nm, or 5 nm. In certain embodiments, the width W7 is or is greater than 2 nm, 3 nm, 4 nm, 5 nm, 6 nm, or 7 nm. In certain embodiments, the width W7 is or is less than 8 nm, 7 nm, 6 nm, 5 nm, 4 nm, or 3 nm. In certain embodiments, the ratio of width W7 to width W6 is or is greater than 1:6, 1:5, 1:4, 1:3, 2:5, 1:2, 3:5, 2:3, 3:4, 4:5, or 5:6. In certain embodiments, the ratio of width W7 to width W6 is or is less than 5:6, 4:5, 3:4, 2:3, 3:5, 1:2, 2:5, 1:3, 1:4, 1:5, or 1:6.

In the structure of FIG. 11, the remaining lower sidewall portion 56 retains width W2 (shown in FIG. 5), and the lower replacement portion 96 retains width W4 (shown in FIG. 6). As further shown in FIG. 11, the remaining upper replacement portion 95 has a thickness or width W8 in the y-direction. In exemplary embodiments, width W8 is or is greater than 0.25 nm, 0.5 nm, 0.75 nm, 1 nm, 1.25 nm, 1.5 nm, 1.75 nm, or 2 nm. In certain embodiments, the width W8 is or is less than 2 nm, 1.75 nm, 1.5 nm, 1.25 nm, 1 nm, 0.75 nm, 0.5 nm, or 0.25 nm.

In exemplary embodiments, the ratio of width W8 to width W5 is or is greater than 1:10, 1:8, 1:6, 1:5, 1:4, 1:3, or 1:2. In certain embodiments, the ratio of width W8 to width W5 is or is less than 1:2, 1:3, 1:4, 1:5, 1:6, 1:8 or 1:10.

In certain embodiments, the total height H8 can be in a range from about 30 nm to about 130 nm, such as about 80 nm. In certain embodiments, the ratio of height H6 to height H7 is or is greater than 1:6, 1:5, 1:4, 1:3, 2:5, 1:2, 3:5, 2:3, 3:4, 4:5, 5:6, 1:1, 6:5, 5:4, 4:3, 3:2, 5:3, 2:1, 5:2, 3:1, 4:1, 5:1, or 6:1. In certain embodiments, the ratio of height H6 to height H7 is or is less than 6:1, 5:1, 4:1, 3:1, 5:2, 2:1, 5:3, 3:2, 4:3, 5:4, 6:5, 1:1, 5:6, 4:5, 3:4, 2:3, 3:5, 1:2, 2:5, 1:3, 1:4, 1:5, or 1:6.

Figure 12:
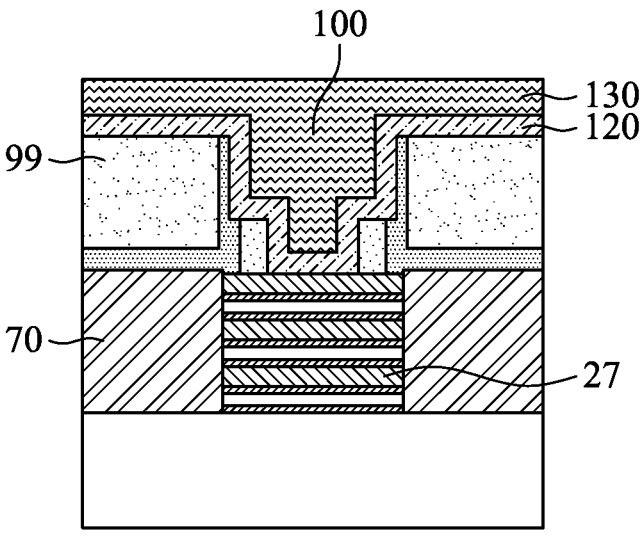
Figure 13:
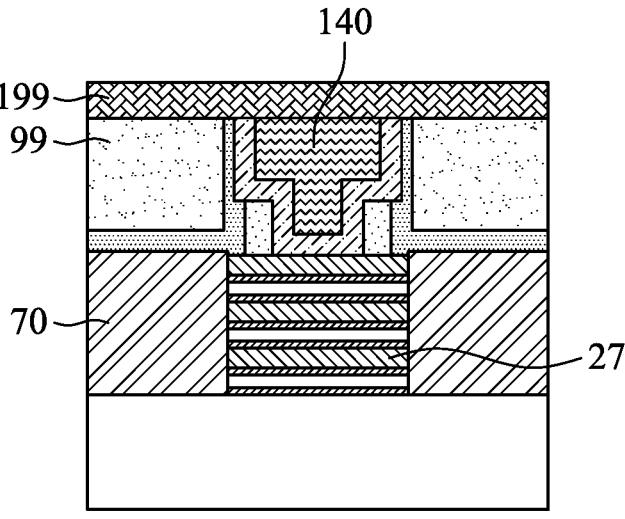

Method 10 (FIG. 1) may continue with formation of a replacement gate in the gate cavity, as shown in FIGS. 12-13.

In FIG. 12, at operation S128, the method 10 (FIG. 1) fills the gate cavity 100 with replacement gate material. Specifically, a gate dielectric layer(s) 120 and gate electrode material 130 are formed in the gate cavity. Gate dielectric layer(s) 120 is deposited conformally in the gate cavity 100. The gate dielectric layer(s) 120 may also be formed on top surface of the ILD 99.

As shown, in the embodiment of FIG. 12, layers 28 (shown in FIG. 3B) were previously removed such that cavities or voids surrounded remaining layers 27. As shown, the replacement gate material also fills the cavities between first semiconductor layers 27 that are formed when second semiconductor layers 28 were removed. For example, gate dielectric layer(s) 120 is formed on the first semiconductor layers 27 and gate electrode material 130 is formed on the gate dielectric layer(s) 120. Thus, each first semiconductor layer 27 is wrapped in gate dielectric 120 and surrounded by gate electrode material 130. Though not illustrated, a spacer or other structures may be located between the source/drain regions 70 and the replacement gate material formed around the first semiconductor layers 27.

In accordance with some embodiments, the gate dielectric layer(s) 120 comprises silicon oxide, silicon nitride, or multilayers thereof. In some embodiments, the gate dielectric layer(s) 120 is a high-k dielectric material, and in these embodiments, the gate dielectric layer(s) 120 may have a k value greater than about 7.0, and may include a metal oxide or a silicate of Hf, Al, Zr, La, Mg, Ba, Ti, Pb, and combinations thereof. The formation methods of the gate dielectric layer(s) 120 may include Molecular-Beam Deposition (MBD), ALD, PECVD, and the like.

As shown in FIG. 12, the gate electrode material 130 is deposited over the gate dielectric layer(s) 120 and fills the remaining portion of the cavity 100. The gate electrode material 130 may be a metal-containing material such as TiN, TaN, TaC, Co, Ru, Al, combinations thereof, or multilayers thereof. For example, although a single gate electrode material is illustrated, any number of work function tuning layers may be deposited in the cavity 100.

In FIG. 13, at operation S130, the method 10 (FIG. 1) forms the replacement gate 140 by removing the excess portions of the gate dielectric layer(s) 120 and the gate electrode material 130 located over the top surface of the ILD 99. For example, a planarization process, such as a CMP, may be performed to remove the excess portions of the gate dielectric layer(s) 120 and the gate electrode material 130. The remaining portions of material of the gate dielectric layer(s) 120 and the gate electrode material 130 thus form the replacement gate 140 of the resulting FinFETs. The gate dielectric layer(s) 120 and gate electrode material 130 may be collectively referred to as a "gate," a "gate stack," or a "gate structure." The gate structure may extend along sidewalls of a channel region of the fin structures.

In some embodiments, the widening of the top opening of gate cavity may allow the gate dielectric layers and/or the gate electrodes to be more easily deposited in the gate cavity. For example, in some embodiments the gate dielectric layers and/or the gate electrodes may be deposited with less voids or seams, or no voids or seams. Accordingly, the resistance of the gate structure may be reduced, and/or performance of the FinFET device may be improved. In some embodiments, the resistance of the gate structure may be reduced by about 10% to about 20%. Manufacturing yields may be improved in some embodiments.

As further shown in FIG. 13, at operation S132, the method 10 (FIG. 1) deposits an ILD 199 over the ILD 99. In an embodiment, the ILD 199 is a flowable film formed by a flowable CVD method. In some embodiments, the ILD 199 is formed of a dielectric material such as PSG, BSG, BPSG, USG, or the like, and may be deposited by any suitable method, such as CVD and PECVD.

Figure 14:
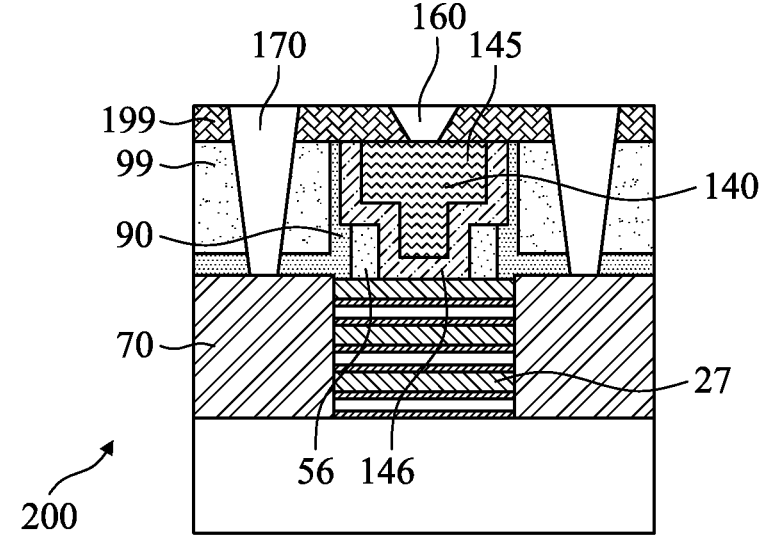

In FIG. 14, at operation S134, the method 10 (FIG. 1) forms the contacts 160 and 170 through the ILD 199 and the ILD 99 to form structure 200. The contacts 160 and 170 are formed of tungsten in some embodiments, although any suitable metal material may be used. In some embodiments, an anneal process may be performed to form a silicide at the interface between the epitaxial source/drain regions 70 and the contacts 170 prior to the contacts 170 being formed. The contact 160 is physically and electrically connected to the replacement gate 140, and the contacts 170 are physically and electrically connected to the epitaxial source/drain regions 70.

FIG. 14 illustrates the contacts 160 and 170 in a same cross-section; however, in other embodiments, the contacts 160 and 170 may be disposed in different cross-sections. Further, the position of contacts 160 and 170 in FIG. 14 is merely illustrative and not intended to be limiting in any way. For example, the contact 160 may be vertically aligned with the fin structure 26 as illustrated or may be disposed at a different location on the replacement gate 140. Furthermore, the contacts 170 may be formed prior to, simultaneously with, or after forming the contacts 160.

In the exemplary embodiment of FIG. 14, a GAA device is formed and includes an active channel region defined by first semiconductor layers 27. In FIG. 14, gate structure 140 includes an upper gate portion 145 that fills and is coterminous with the upper cavity portion 105, as well as a lower gate portion 146 that fills and is coterminous with the lower cavity portion 106. Thus, the upper portion 145 has width W6 (shown in FIG. 11), and the lower gate portion 146 has width W7 (shown in FIG. 11). Width W6 is greater than width W7. As, shown, remaining lower sidewall portion (or first layer) 56 is adjacent to the lower gate portion 146 and is below the upper gate portion 145. Further, replacement spacer structure (or a second layer) 90 is adjacent to the first layer 56 at the lower gate portion 146, and is adjacent to the upper gate portion 145. Adjacent to the lower gate portion 146, the first layer 56 has width W2 (shown in FIG. 5) and the second layer 90 has width W4 (shown in FIG. 6), greater than width W2.

As described herein, in some embodiments a sacrificial gate is formed, and a spacer is formed along sidewalls of the sacrificial gate. The sacrificial gate is removed, thereby forming a gate cavity having sidewalls that are defined at least by part by the spacer. A treatment is performed on portions of the exposed spacer sidewalls. In some embodiments, the treatment may include a plasma treatment. The treatment may change a material composition of the portions of the spacer. In some embodiments, for example because of the aspect ratio of the gate cavity, the treatment may penetrate more deeply into top portions of the spacer than bottom portions of the spacer. The treated portions of the spacer are then removed. Because the treatment process penetrated more deeply into the top portions of the spacer than the bottom portions of the spacer, the removal of the treated portions of the spacer may cause a larger portion of the top regions of the spacer to be removed than the bottom portions of the spacer. Accordingly, after the treated portions of the spacer are removed, a length of the gate cavity in at least a top portion of the gate cavity may be widened. A length of the gate cavity in a bottom portion of the gate cavity (for example near the channel region) may be substantially unchanged. Additionally, the gate cavity may have one or more tapered sidewalls. Next, a gate dielectric layer is deposited along sidewalls and a bottom surface of the cavity, and then the remaining portions of the gate cavity are filled by depositing one or more gate tuning layers and one or more gate electrode layers in the gate cavity.

Because of the widening of the opening in the top of the gate cavity, the filling of the gate cavity by the one or more gate tuning layers and one or more gate electrodes may be more easily performed. For example, in some processes where a gate cavity is filled by metal layers, such as gate tuning layers or gate electrode layers, when the cavity has a high aspect ratio the filling of the gate cavity may result in the creation of one or more voids and/or seams in the filled metal portions. A gate structure that contains a void or seam may experience a degradation of performance. For example, the gate resistance of the gate structure may be increased due to the presence of a void or seam. The gate structure may experience increased delay due to the presence or a void or seam. In accordance with some embodiments, the widening of the gate cavity enables filling of the gate cavity to be performed with reduced voids or cavities, or no voids or cavities. As such, performance of the gate structure may be improved.

A method is provided in accordance with some embodiments. The method includes forming an initial spacer structure, wherein the initial spacer structure has an initial etch rate for a selected etchant. The method further includes removing a portion of the initial spacer structure, wherein a remaining portion of the initial spacer structure is not removed. Also, the method includes forming a replacement spacer structure adjacent to the remaining portion of the initial spacer structure to form a combined spacer structure, wherein the combined spacer structure has an intermediate etch rate for the selected etchant that is less than the initial etch rate for a selected etchant. Further, the method includes etching the combined spacer structure with the selected etchant to form a final spacer structure.

In certain embodiments, the method further includes, before etching the combined spacer structure with the selected etchant to form the final spacer structure, removing an upper portion of the combined spacer structure to define a same height for the remaining portion of the initial spacer structure and for the replacement spacer structure. In such embodiments, after etching the combined spacer structure with the selected etchant to form the final spacer structure, at least a final portion of the replacement spacer structure retains the same height. In such embodiments, after etching the combined spacer structure with the selected etchant to form the final spacer structure, the remaining portion of the initial spacer structure does not retain the same height. In such embodiments, the initial spacer structure has an initial width, and wherein the combined spacer structure has an intermediate width, and wherein the intermediate width is at least 90% of the initial spacer width.

In certain embodiments, the initial spacer structure is formed from SiOCN and the replacement spacer structure is formed from silicon carbon nitride (SiCN). With such materials, a selected etchant, for example diluted hydrofluoric acid (dHF), may etch the initial spacer structure at a greater etch rate, i.e., faster, than the selected etchant etches the replacement spacer structure.

By combining the initial spacer structure and replacement spacer structure, a combined spacer structure may be designed with a tunable methodology for metal gate critical dimension control. Specifically, widths W1, W2, W3, W4, W5, W6, W7, and/or W8 may be selected, and heights H6, H7 and/or H8 may be selected, and the materials forming initial spacer structure and replacement spacer structure may be selected in view their relative etch rates to provide an easily controlled process with reduced defects.

In certain embodiments, the initial spacer structure is formed around a sacrificial gate structure, and the method includes removing the initial spacer structure when etching the combined spacer structure with the selected etchant to form a final spacer structure.

A method is provided in accordance with some embodiments. The method includes forming a sidewall spacer around a sacrificial gate structure, wherein the sidewall spacer has an inner surface adjacent the sacrificial gate structure and has an outer surface distanced from the inner surface by an initial spacer width. The method further includes forming an epitaxial structure adjacent to the outer surface of the sidewall spacer. Also, the method includes etching the sidewall spacer to form the sidewall spacer with a recessed outer surface wherein the recessed outer surface is distanced from the inner surface by a reduced spacer width. The method further includes forming an etch stop layer over the sidewall spacer, wherein the etch stop layer has an inner side adjacent the recessed outer surface of the sidewall spacer and has an outer side distanced from the inner side by an etch stop layer width. The method also includes depositing an interlayer dielectric material. Further, the method includes removing a portion of the interlayer dielectric material over the sacrificial gate structure and removing the sacrificial gate structure to form a gate cavity, wherein the gate cavity is separated from the ILD by the etch stop layer.

In certain embodiments of the method, removing the sacrificial gate structure to form the gate cavity includes etching with an etchant, the etchant etches the sidewall spacer at a first etch rate and etches the etch stop layer at a second etch rate, and the first etch rate is greater than the second etch rate.

In certain embodiments of the method, removing the sacrificial gate structure to form the gate cavity includes etching with an etchant, the etchant etches the sidewall spacer at a first etch rate and etches the etch stop layer at a second etch rate, and the first etch rate is at least three times greater than the second etch rate.

In certain embodiments of the method, removing the sacrificial gate structure to form the gate cavity includes etching with an etchant, the etchant etches the sidewall spacer at a first etch rate and etches the etch stop layer at a second etch rate, and the first etch rate is at least five times greater than the second etch rate.

In certain embodiments of the method, the outer side of the etch stop layer is distanced from the inner surface of the sidewall spacer by a total width, and the etch stop layer width to total width ratio is at least 1:3.

In certain embodiments of the method, the outer side of the etch stop layer is distanced from the inner surface of the sidewall spacer by a total width, and the total width is at least 90% of the initial spacer width.

In certain embodiments of the method, the outer side of the etch stop layer is distanced from the inner surface of the sidewall spacer by a total width, and the total width is substantially equal to the initial spacer width.

In certain embodiments of the method, removing the sacrificial gate structure to form the gate cavity includes forming an upper portion of the cavity that directly contacts the etch stop layer and forming a lower portion of the cavity that directly contacts a remaining portion of the sidewall spacer.

In certain embodiments of the method, the epitaxial structure has a height extending from a lower surface to an upper surface, and etching the sidewall spacer to form the sidewall spacer with the recessed outer surface includes etching the epitaxial structure to form the epitaxial structure with a recessed upper surface and a reduced height.

In certain embodiments of the method, the sacrificial gate structure has a height extending from a lower surface to an upper surface, and etching the sidewall spacer to form the sidewall spacer with the recessed outer surface includes etching the sacrificial gate structure to form the sacrificial gate structure with a recessed upper surface and a reduced height.

In certain embodiments of the method, removing the sacrificial gate structure to form the gate cavity includes etching with diluted hydrofluoric acid (dHF), the dHF etches the sidewall spacer at a first etch rate and etches the etch stop layer at a second etch rate, and the first etch rate is greater than the second etch rate. In certain embodiments of the method, the sidewall spacer is formed from SiOCN and the etch stop layer is formed from SiCN.

A device is provided in accordance with some embodiments. The device includes a gate structure having a lower portion and an upper portion, wherein the lower portion has a first gate width, the upper portion has a second gate width greater than the first gate width. The device also includes a lower spacer adjacent to the lower portion of the gate structure and below the upper portion of the gate structure. Further, the device includes an outer spacer including a base portion and a top portion. The base portion is adjacent to the lower spacer and the top portion is adjacent to the upper portion of the gate structure. The lower spacer has a first spacer width, the base portion of the outer spacer has a second spacer width, the top portion of the outer spacer has a third spacer width, the second spacer width is greater than the first spacer width, the first spacer width is greater than the third spacer width.

In certain embodiments of the device, a ratio of the second gate width to the first gate width is or is less than 5:6.

In certain embodiments of the device, at least a region of the base portion lies directly under the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present.

What is claimed is:

1. A method, comprising:
    forming an initial spacer structure around a sacrificial gate structure by depositing an initial spacer material over the sacrificial gate structure and etching the initial spacer material so that the initial spacer material remains on a sidewall of the sacrificial gate structure, wherein the sacrificial gate structure has a height extending from a lower surface to an upper surface;
    forming a replacement spacer structure;
    etching the sacrificial gate structure to form the sacrificial gate structure with a recessed upper surface and a reduced height and to uncover an inner sidewall surface of an upper portion of the initial spacer structure; and
    etching the inner sidewall surface of the upper portion of the initial spacer structure laterally to widen a cavity, wherein a remaining portion of the initial spacer structure is not removed, wherein the remaining portion of the initial spacer structure is laterally adjacent to the sacrificial gate structure and below the cavity, wherein the replacement spacer structure is adjacent to the remaining portion of the initial spacer structure, and wherein the remaining portion of the initial spacer structure and the replacement spacer structure form a combined spacer structure.

2. The method of claim 1, wherein the initial spacer structure has a faster etch rate than the replacement spacer structure for a selected etchant.

3. The method of claim 1, wherein etching the inner sidewall surface of the initial spacer structure laterally to widen the cavity comprises removing the upper portion of the initial spacer structure located above the reduced height of the sacrificial gate structure.

4. The method of claim 1, wherein etching the inner sidewall surface of the upper portion of the initial spacer structure laterally to widen the cavity comprises uncovering an inner surface of the replacement spacer structure facing the cavity and etching the inner surface of the replacement spacer structure.

5. The method of claim 1, wherein:
    the initial spacer structure has a first outer sidewall surface and an opposite second outer sidewall surface;
    the replacement spacer structure is formed on the first outer sidewall surface and the second outer sidewall surface of the initial spacer structure;
    the initial spacer structure has a spacer width defined from the first outer sidewall surface to the second outer sidewall surface; and
    after etching the inner sidewall surface of the initial spacer structure laterally to widen the cavity, the cavity has a cavity width greater than the spacer width.

6. The method of claim 1, wherein the initial spacer structure is formed from SiOCN and the replacement spacer structure is formed from SiCN.

7. The method of claim 2, wherein the method further comprises etching the combined spacer structure with the selected etchant to form a final spacer structure; and wherein the method comprises removing the initial spacer structure when etching the combined spacer structure with the selected etchant to form the final spacer structure.

8. A method, comprising:

forming a sidewall spacer around a sacrificial gate structure, wherein the sidewall spacer has an inner surface adjacent the sacrificial gate structure and has an outer surface distanced from the inner surface by an initial spacer width;

forming an epitaxial structure adjacent to the outer surface of the sidewall spacer, wherein the epitaxial structure has a height extending from a lower surface to an upper surface;

etching the sidewall spacer to form the sidewall spacer with a recessed outer surface wherein the recessed outer surface is distanced from the inner surface by a reduced spacer width, wherein etching the sidewall spacer to form the sidewall spacer with the recessed outer surface comprises etching the epitaxial structure to form the epitaxial structure with a recessed upper surface and a reduced height;

forming an etch stop layer over the sidewall spacer, wherein the etch stop layer has an inner side adjacent the recessed outer surface of the sidewall spacer and has an outer side distanced from the inner side by an etch stop layer width;

depositing an interlayer dielectric material;

removing a portion of the interlayer dielectric material over the sacrificial gate structure; and removing the sacrificial gate structure to form a gate cavity, wherein the gate cavity is separated from the interlayer dielectric material by the etch stop layer.

9. The method of claim 8, wherein removing the sacrificial gate structure to form the gate cavity comprises etching with an etchant, wherein the etchant etches the sidewall spacer at a first etch rate and etches the etch stop layer at a second etch rate, and wherein the first etch rate is greater than the second etch rate.

10. The method of claim 8, wherein removing the sacrificial gate structure to form the gate cavity comprises etching with an etchant, wherein the etchant etches the sidewall spacer at a first etch rate and etches the etch stop layer at a second etch rate, and wherein the first etch rate is at least three times greater than the second etch rate.

11. The method of claim 8, wherein removing the sacrificial gate structure to form the gate cavity comprises etching with an etchant, wherein the etchant etches the sidewall spacer at a first etch rate and etches the etch stop layer at a second etch rate, and wherein the first etch rate is at least five times greater than the second etch rate.

12. The method of claim 8, wherein the outer side of the etch stop layer is distanced from the inner surface of the sidewall spacer by a total width, and wherein a ratio of the etch stop layer width to the total width is at least 1:3.

13. The method of claim 8, wherein the outer side of the etch stop layer is distanced from the inner surface of the sidewall spacer by a total width, and wherein the total width is at least 90% of the initial spacer width.

14. The method of claim 8, wherein the outer side of the etch stop layer is distanced from the inner surface of the sidewall spacer by a total width, and wherein the total width is substantially equal to the initial spacer width.

15. The method of claim 8, wherein removing the sacrificial gate structure to form the gate cavity comprises forming an upper portion of the gate cavity that directly contacts the etch stop layer and forming a lower portion of the gate cavity that directly contacts a remaining portion of the sidewall spacer.

16. The method of claim 8, wherein the sacrificial gate structure has a height extending from a lower surface to an upper surface, and wherein etching the sidewall spacer to form the sidewall spacer with the recessed outer surface comprises etching the sacrificial gate structure to form the sacrificial gate structure with a recessed upper surface and a reduced height.

17. The method of claim 8, wherein:

removing the sacrificial gate structure to form the gate cavity comprises etching with an etchant;

the etchant etches the sidewall spacer at a first etch rate and etches the etch stop layer at a second etch rate;

the first etch rate is greater than the second etch rate;

the outer side of the etch stop layer is distanced from the inner surface of the sidewall spacer by a total width; and a ratio of the etch stop layer width to the total width is at least 1:3.

18. The method of claim 8, wherein:

the outer side of the etch stop layer is distanced from the inner surface of the sidewall spacer by a total width;

a ratio of the etch stop layer width to the total width is at least 1:3;

the total width is at least 90% of the initial spacer width.

19. The method of claim 8, wherein:

removing the sacrificial gate structure to form the gate cavity comprises etching with an etchant;

removing the sacrificial gate structure to form the gate cavity comprises forming an upper portion of the gate cavity that directly contacts the etch stop layer and forming a lower portion of the gate cavity that directly contacts a remaining portion of the sidewall spacer;

the etchant etches the sidewall spacer at a first etch rate and etches the etch stop layer at a second etch rate;

the first etch rate is greater than the second etch rate;

the outer side of the etch stop layer is distanced from the inner surface of the sidewall spacer by a total width;

a ratio of the etch stop layer width to the total width is at least 1:3;

the total width is at least 90% of the initial spacer width;

the epitaxial structure has a height extending from a lower surface to an upper surface;

etching the sidewall spacer to form the sidewall spacer with the recessed outer surface comprises etching the epitaxial structure to form the epitaxial structure with a recessed upper surface and a reduced height.

20. A method, comprising:

forming an initial spacer structure;

forming an epitaxial structure adjacent to the initial spacer structure, wherein the epitaxial structure has a height extending from a lower surface to an upper surface;

removing a portion of the initial spacer structure, wherein a remaining portion of the initial spacer structure is not removed, and wherein removing the portion of the initial spacer structure comprises etching the epitaxial structure to form the epitaxial structure with a recessed upper surface and a reduced height;

forming a replacement spacer structure adjacent to the remaining portion of the initial spacer structure to form a combined spacer structure, wherein the initial spacer structures etches faster than the replacement spacer structure for a selected etchant; and etching the combined spacer structure with the selected etchant to form a final spacer structure.

* * * * *